United States Patent [19]

Fukui et al.

[11] Patent Number: 4,775,512

[45] Date of Patent: Oct. 4, 1988

[54] GOLD LINE FOR BONDING SEMICONDUCTOR ELEMENT

[75] Inventors: Yasuo Fukui; Koichiro Mukoyama; Hiromi Yamamoto, all of Tokyo, Japan

[73] Assignee: Tanaka Denshi Kogyo Kabushiki Kaisha, Tokyo, Japan

[21] Appl. No.: 863,530

[22] Filed: May 15, 1986

[30] Foreign Application Priority Data

Oct. 1, 1985 [JP] Japan ................................ 60-219593
Oct. 26, 1985 [JP] Japan ................................ 60-241121

[51] Int. Cl.$^4$ .............................................. C22C 5/02
[52] U.S. Cl. ..................................... 420/507; 428/606
[58] Field of Search ......................... 420/507; 428/606

[56] References Cited

U.S. PATENT DOCUMENTS 4,080,485  3/1978  Bonkohara ......................... 420/507

FOREIGN PATENT DOCUMENTS

| 112060 | 9/1978 | Japan | 420/507 |
|---|---|---|---|
| 54-24265 | 8/1979 | Japan . | |
| 19629 | 2/1981 | Japan | 420/507 |
| 30731 | 3/1981 | Japan | 420/507 |

Primary Examiner—L. Dewayne Rutledge
Assistant Examiner—Robert L. McDowell
Attorney, Agent, or Firm—Sandler & Greenblum

[57] ABSTRACT

This invention relates to a wire bonding gold line used for connecting a semiconductor tip electrode with an outside lead portion. This gold wire characteristically contains gold (Au) having a purity level 99.996–99.9995 wt % and 0.0032–0.008 wt % by total weight of said gold wire of germanium (Ge) so that the electric resistance of the wire bonding gold line is reduced, while the mechanical strength such as tensile strength and high temperature strength is excellent and a gold ball can be shaped into the form of a nearly perfect sphere in the connection of the tip electrode.

3 Claims, No Drawings

GOLD LINE FOR BONDING SEMICONDUCTOR ELEMENT

BACKGROUND OF THE INVENTION (1) Field of the Invention

This invention relates to a wire bonding gold line used for interconnecting a semiconductor tip electrode and an outside lead portion.

(2) Description of the Prior Art

The gold lines heretofore used for TC bonding methods as disclosed in the Official Gazette of Japanese Patent No. Sho 54-24265 contain gold having a purity level of 99.995 wt% and between about 0.0003–0.0030 wt% of germanium(Ge). The germanium is included to minimize the effect of impurity elements and to reduce the electric resistance by improving further the purity of itself.

However, when the purity of said gold line is improved, in this manner the additional amount of germanium weakens the mechanical strength of the gold line. Hence, it was found that the gold line often tends to break during wire drawing, such that the yield is degraded. In addition, other problems tend to occur during bonding.

Inasmuch as the additional amount of said germanium enhances properties of the gold line as to elongation elongation, the presence of germanium tends to reduce the strength of the gold and reduce its malleability. Thus, the loop shape becomes less stable. In addition, problems are encountered because of reduced bonding strength and more neck breakage tends to take place.

It has been observed, however, that when the additional amount of germanium is increased to amounts exceeding 0.006 wt%, the elongation properties become somewhat reduced but the strength of the alloy increases. Nevertheless, the problem is that the gold line becomes too hard and the bonding strength in a second bonding portion is weakened which tends to result with defective bonding. Accordingly, prior attempts to improve gold alloys for this purpose have not resulted with an acceptable alloy from the standpoint of satisfactory mechanical strength in addition to the respective elongation and strength properties.

SUMMARY OF THE INVENTION

An object of this invention is to provide a gold line for bonding which has low electric resistance and excellent mechanical strength such as tensile strength and high temperature strength and capable of being formed into an essentially perfect spherical gold ball.

Another object of this invention is to provide a gold line for bonding which possesses high strength and minimal tendencies to neck breakage after bonding.

The gold line for bonding according to this invention containing 99.996–99.99995 wt% of high purity gold (AU) and 0.0032–0.008 wt% by total weight of the gold line (Ge) and is produced by electrolytic refining methods and strip melting refining method so as to avoid the effect of impurity elements and reduce the electrical resistance, while retaining excellent mechanical strength such as tensile strength, and high temperature strength, and being capable of being formed of a gold ball having a nearly perfect spherical shape.

The present invention is based upon the discovery that the presence of 0.0032% or less of said germanium (Ge) by total weight of the gold line is ineffective for such purposes and 0.008% or more of said germanium tends to harden the gold line too much to be suitable for such uses.

Also, the gold line containing high purity gold (Au), i.e. 99.996–99.99995 wt%, and 0.0032–0.008 wt% of germanium (Ge) and beryllium (Be) provides a particularly preferred gold alloy for purposes of bonding because the mechanical strength, such as tensile strength and high temperature strength, and the bonding strength after bonding are increased by the synergism of germanium (Ge) and beryllium (Be) and the neck breakage does not occur.

The additional amount of said beryllium (Be) is 0.00001–0.00009 wt% and it has been observed 0.0032 wt% or less of germanium (Ge) and 0.00001 wt% or less of beryllium (Be) in the total additional amount of these germanium (Ge) and beryllium (Be) in the alloys do not have the previously mentioned synergism of both elements so that the mechanical strength. In this regard, the tensile strength and high temperature strength and the bonding strength after bonding are relatively low.

Moreover, 0.0060 wt% or more of germanium (Ge) and 0.00009 wt% or more of beryllium (Be) tend to make the gold line hard and unusable due to the breakage of grain boundary.

Furthermore, the total additional amount of germanium (Ge) and beryllium (Be) within the extent of purity of said gold line is preferably increased as the purity of gold is high and reduced as the purity is low related to this.

The total amount of said germanium (Ge) and beryllium (Be) preferably is made up of 0.00009 wt% of beryllium (Be) when the amount of germanium is low, for example 0.0032 wt%; or 0.00001 wt% of beryllium (Be) when the amount of germanium is high, for example 0.0060 wt%. The optimum values are 0.0040 wt% of germanium (Ge) and 0.00005 wt% of beryllium (Be).

DESCRIPTION OF THE PREFERRED EMBODIMENTS

Hereinafter will be shown embodiments of this invention.

EMBODIMENT 1

Respective samples of embodiments of this invention are those of gold lines in which high purity germanium (Ge) is added to high purity gold (Au), i.e., containing 99.997 wt%, 99.999 wt%, 99.9999 wt% and 99.99995 wt% of gold (Au), respectively, melted, cast, subjected repetitively to wire drawing and intermediate heat treatment and finished to give 0.025 mm diameter.

The following table (1) shows the results of measuring the mechanical strength such as tensile strength and high temperature strength and the shape of ball, No. 1–6 in the respective samples representing the embodiments of this invention and No. (1)–(2) representing compared articles.

TABLE (1)

| Sample No. | Au % | Ge wt ppm | Room temperature tension B.L (grf) | Room temperature tension EL (%) | 250° C. tension B.C (grf) | 250° C. tension EL (%) | Ball shape |
|---|---|---|---|---|---|---|---|
| | | | Embodiment | | | | |
| | 99.997 | | | | | | |
| 1 | Residual | 30 | 6.7 | 3.7 | 3.2 | 3.3 | Satisfactory |
| 2 | " | 32 | 7.2 | 3.9 | 3.8 | 4.1 | " |
| 3 | " | 50 | 8.3 | 3.6 | 4.3 | 4.4 | " |
| 4 | " | 70 | 9.5 | 4.1 | 4.8 | 4.6 | " |
| 5 | " | 80 | 10.4 | 3.8 | 5.6 | 5.2 | " |
| 6 | " | 90 | 11.8 | 4.2 | 6.1 | 4.6 | Oxide film is produced on surface |
| | 99.999 | | | | | | |
| 1 | Residual | 30 | 6.6 | 3.5 | 3.3 | 3.3 | Satisfactory |
| 2 | " | 32 | 7.2 | 4.1 | 3.9 | 4.0 | " |
| 3 | " | 50 | 8.2 | 4.0 | 4.1 | 4.3 | " |
| 4 | " | 70 | 9.3 | 3.8 | 4.6 | 4.5 | " |
| 5 | " | 80 | 10.4 | 3.7 | 5.5 | 4.8 | " |
| 6 | " | 90 | 11.7 | 4.0 | 5.9 | 4.7 | Oxide film is produced on surface |
| | 99.9999 | | | | | | |
| 1 | Residual | 30 | 6.6 | 3.4 | 3.3 | 3.2 | Satisfactory |
| 2 | " | 32 | 7.1 | 4.0 | 3.8 | 4.0 | " |
| 3 | " | 50 | 8.2 | 3.9 | 4.2 | 4.2 | " |
| 4 | " | 70 | 9.2 | 3.7 | 4.7 | 4.5 | " |
| 5 | " | 80 | 10.3 | 4.0 | 5.5 | 4.9 | " |
| 6 | " | 90 | 11.7 | 3.8 | 6.0 | 4.8 | Oxide film is produced on surface |
| | 99.99995 | | | | | | |
| 1 | Residual | 30 | 6.4 | 3.3 | 3.4 | 3.1 | Satisfactory |
| 2 | " | 32 | 7.0 | 3.9 | 3.8 | 4.2 | " |
| 3 | " | 50 | 8.1 | 4.0 | 3.9 | 4.2 | " |
| 4 | " | 70 | 9.2 | 3.8 | 4.6 | 4.3 | " |
| 5 | " | 80 | 10.2 | 4.0 | 5.4 | 4.8 | " |
| 6 | " | 90 | 11.6 | 3.9 | 6.1 | 4.7 | Oxide film is produced on surface |
| | | | Compared article | | | | |
| ① | Contains 99.995 wt % of gold and 30 wt ppm of Ge | | 7.0 | 3.8 | 3.8 | 4.1 | Satisfactory |
| ② | 99.999 wt % of Au | | 5.5 | 3.1 | 2.5 | 3.8 | Satisfactory |

As a result, a gold line containing high purity gold, i.e., 99.996–99.9995 wt% of gold, and 0.0032–0.008 wt% by weight of the gold line of germanium (Ge) was confirmed to provide a bonding gold line which can reduce the electric resistance while giving excellent mechanical strength such as tensile strength and high temperature strength and forming a gold ball into nearly perfect sphericalness.

EMBODIMENT 2

Respective samples of embodiments according to this invention are those of gold lines in which germanium (Ge) and beryllium (Be) are added, respectively to gold having a purity level of 99.996 wt%, 99.999 wt%, 99.9999 wt% and 99.99995 wt% of gold (Au), melted, cast, subjected repetitively to wire drawing and intermediate heat treatment and finished to give 25 μm diameter.

The following tables (1), (2), (3) and (4) show the results of measuring the mechanical strength such as tensile strength and high temperature strength, the bonding strength, the presence of neck breakage, etc. of said respective samples, samples No. 1–36 and No. 37, 38 in said respective tables representing respectively the embodiments of this invention and compared articles.

TABLE (1)

| Sample No. | 99.996 wt % of Au | Ge wt ppm | Be wt ppm | Room temperature tension B.L (grf) | Room temperature tension EL (%) | 250° C. tension B.C (grf) | 250° C. tension EL (%) | Bonding strength (grf) | Neck breakage |
|---|---|---|---|---|---|---|---|---|---|
| | | | | Embodiment | | | | | |
| 1 | Residual | 30 | 0.09 | 7.0 | 3.9 | 4.0 | 4.1 | 4.1 | Present |
| 2 | " | 32 | 0.1 | 7.3 | 4.3 | 4.3 | 4.3 | 5.5 | Absent |
| 3 | " | 40 | 0.5 | 8.5 | 5.6 | 4.9 | 5.8 | 6.4 | " |
| 4 | " | 50 | 0.6 | 9.7 | 5.0 | 5.7 | 5.4 | 7.3 | " |
| 5 | " | 60 | 0.9 | 11.0 | 4.0 | 6.0 | 5.8 | 8.3 | " |
| 6 | " | 62 | 1 | 11.8 | 3.6 | 6.5 | 5.9 | 5.3 | Breakage of grain boundary |
| 7 | " | 30 | 0.1 | 7.1 | 4.0 | 4.1 | 4.2 | 4.5 | Absent |
| 8 | " | 32 | 0.5 | 7.6 | 4.5 | 4.7 | 5.1 | 5.7 | " |
| 9 | " | 40 | 0.6 | 8.9 | 5.2 | 5.2 | 5.7 | 6.6 | " |
| 10 | " | 50 | 0.9 | 10.2 | 4.1 | 6.0 | 5.6 | 7.7 | " |
| 11 | " | 60 | 1 | 11.5 | 3.7 | 6.4 | 5.4 | 5.5 | Breakage of grain boundary |
| 12 | " | 62 | 0.09 | 9.0 | 4.4 | 4.6 | 4.7 | 5.1 | Present |

TABLE (1)-continued

| Sample No. | 99.996 wt % of Au | Ge wt ppm | Be wt ppm | Room temperature tension B.L (grf) | Room temperature tension EL (%) | 250° C. tension B.C (grf) | 250° C. tension EL (%) | Bonding strength (grf) | Neck breakage |
|---|---|---|---|---|---|---|---|---|---|
| 13 | " | 30 | 0.5 | 7.4 | 4.3 | 4.4 | 4.6 | 5.2 | Absent |
| 14 | " | 32 | 0.6 | 8.0 | 4.4 | 4.8 | 5.2 | 6.0 | " |
| 15 | " | 40 | 0.9 | 9.0 | 4.5 | 5.6 | 5.5 | 6.8 | " |
| 16 | " | 50 | 1 | 11.0 | 4.0 | 6.2 | 5.5 | 6.2 | Breakage of grain boundary |
| 17 | " | 60 | 0.09 | 8.8 | 4.4 | 4.5 | 4.7 | 5.0 | Present |
| 18 | " | 62 | 0.1 | 9.5 | 4.5 | 5.1 | 5.1 | 5.2 | Oxidation of ball surface |
| 19 | " | 30 | 0.6 | 7.8 | 4.3 | 4.7 | 4.9 | 5.4 | Absent |
| 20 | " | 32 | 0.9 | 8.8 | 4.3 | 5.3 | 5.2 | 6.2 | " |
| 21 | " | 40 | 1 | 10.5 | 4.2 | 6.0 | 5.5 | 5.9 | Breakage of grain boundary |
| 22 | " | 50 | 0.09 | 8.5 | 4.6 | 4.4 | 4.6 | 4.7 | Present |
| 23 | " | 60 | 0.1 | 9.2 | 4.6 | 5.0 | 5.0 | 6.4 | Absent |
| 24 | " | 62 | 0.5 | 10.4 | 4.8 | 5.5 | 6.1 | 5.0 | Oxidation of ball surface |
| 25 | " | 30 | 0.9 | 8.6 | 4.2 | 5.0 | 5.0 | 5.4 | Absent |
| 26 | " | 32 | 1 | 9.0 | 4.2 | 5.7 | 5.1 | 5.8 | Breakage of grain boundary |
| 27 | " | 40 | 0.09 | 8.1 | 4.5 | 4.2 | 4.5 | 4.5 | Present |
| 28 | " | 50 | 0.1 | 8.8 | 4.8 | 4.8 | 4.9 | 6.2 | Absent |
| 29 | " | 60 | 0.5 | 10.3 | 4.9 | 5.3 | 6.0 | 7.7 | " |
| 30 | " | 62 | 0.6 | 11.0 | 4.6 | 5.9 | 6.2 | 4.9 | Oxidation of ball surface |
| 31 | " | 30 | 1 | 8.8 | 4.2 | 5.6 | 5.0 | 5.5 | Absent |
| 32 | " | 32 | 0.09 | 7.1 | 4.2 | 4.1 | 4.1 | 4.2 | Present |
| 33 | " | 40 | 0.1 | 8.6 | 4.9 | 4.5 | 4.7 | 6.0 | Absent |
| 34 | " | 50 | 0.5 | 9.1 | 5.3 | 5.1 | 5.9 | 6.8 | " |
| 35 | " | 60 | 0.6 | 10.7 | 4.6 | 5.8 | 6.1 | 8.0 | " |
| 36 | " | 62 | 0.9 | 11.3 | 3.9 | 6.3 | 5.9 | 4.7 | Oxidation of ball surface |
| | | | | Compared article | | | | | |
| 37 | Contains 99.995 wt % of gold, 0.0030 wt % of Ge and 0.00009 wt % of Be | | | 7.2 | 4.1 | 4.3 | 3.8 | 4.2 | Present |
| 38 | 99.999 wt % of Au | | | 5.5 | 3.1 | 2.5 | 3.8 | 2.8 | " |

TABLE (2)

| Sample No. | 99.9999 wt % of Au | Ge wt ppm | Be wt ppm | Room temperature tension B.L (grf) | Room temperature tension EL (%) | 250° C. tension B.C (grf) | 250° C. tension EL (%) | Bonding strength (grf) | Neck breakage |
|---|---|---|---|---|---|---|---|---|---|
| | | | | Embodiment | | | | | |
| 1 | Residual | 30 | 0.09 | 6.9 | 4.0 | 3.9 | 4.0 | 4.0 | Present |
| 2 | " | 32 | 0.1 | 7.2 | 4.4 | 4.2 | 4.3 | 5.7 | Absent |
| 3 | " | 40 | 0.5 | 8.3 | 5.8 | 4.8 | 5.6 | 6.6 | " |
| 4 | " | 50 | 0.6 | 9.5 | 5.1 | 5.5 | 5.8 | 7.5 | " |
| 5 | " | 60 | 0.9 | 10.7 | 4.1 | 5.8 | 5.7 | 8.4 | " |
| 6 | " | 62 | 1 | 11.5 | 3.6 | 6.3 | 5.3 | 5.3 | Breakage of grain boundary |
| 7 | " | 30 | 0.1 | 7.0 | 4.1 | 4.0 | 4.1 | 4.6 | Absent |
| 8 | " | 32 | 0.5 | 7.4 | 4.6 | 4.6 | 5.0 | 5.8 | " |
| 9 | " | 40 | 0.6 | 8.7 | 5.4 | 5.1 | 5.6 | 6.8 | " |
| 10 | " | 50 | 0.9 | 9.9 | 4.2 | 5.8 | 5.5 | 7.9 | " |
| 11 | " | 60 | 1 | 11.2 | 3.8 | 6.3 | 5.3 | 5.6 | Breakage of grain boundary |
| 12 | " | 62 | 0.09 | 8.8 | 4.4 | 4.5 | 4.6 | 5.0 | Present |
| 13 | " | 30 | 0.5 | 7.3 | 4.4 | 4.3 | 4.5 | 5.4 | Absent |
| 14 | " | 32 | 0.6 | 7.8 | 4.5 | 4.7 | 5.0 | 6.1 | " |
| 15 | " | 40 | 0.9 | 8.8 | 4.6 | 5.5 | 5.4 | 7.0 | " |
| 16 | " | 50 | 1 | 10.7 | 4.1 | 6.0 | 5.4 | 6.4 | Breakage of grain boundary |
| 17 | " | 60 | 0.09 | 8.6 | 4.5 | 4.4 | 4.6 | 4.9 | Present |
| 18 | " | 62 | 0.1 | 9.3 | 4.5 | 5.0 | 4.9 | 5.3 | Oxidation of ball surface |
| 19 | " | 30 | 0.6 | 7.6 | 4.4 | 4.6 | 4.8 | 5.5 | Absent |
| 20 | " | 32 | 0.9 | 8.6 | 4.3 | 5.2 | 5.0 | 6.4 | " |
| 21 | " | 40 | 1 | 10.3 | 4.2 | 5.9 | 5.4 | 6.0 | Breakage of grain boundary |
| 22 | " | 50 | 0.09 | 8.3 | 4.7 | 4.3 | 4.5 | 4.6 | Present |
| 23 | " | 60 | 0.1 | 9.0 | 4.7 | 4.9 | 4.9 | 6.5 | Absent |
| 24 | " | 62 | 0.5 | 10.1 | 4.9 | 5.4 | 5.9 | 5.1 | Oxidation of ball surface |
| 25 | " | 30 | 0.9 | 8.4 | 4.2 | 4.9 | 4.9 | 5.8 | Absent |
| 26 | " | 32 | 1 | 8.8 | 4.2 | 5.5 | 4.9 | 5.9 | Breakage of grain boundary |
| 27 | " | 40 | 0.09 | 7.9 | 4.5 | 4.1 | 4.4 | 4.3 | Present |
| 28 | " | 50 | 0.1 | 8.6 | 4.8 | 4.7 | 4.8 | 6.3 | Absent |
| 29 | " | 60 | 0.5 | 10.0 | 5.0 | 5.2 | 5.8 | 7.9 | " |
| 30 | " | 62 | 0.6 | 10.7 | 4.7 | 5.8 | 6.1 | 5.1 | Oxidation of ball surface |
| 31 | " | 30 | 1 | 8.6 | 4.2 | 5.4 | 4.8 | 5.8 | Absent |
| 32 | " | 32 | 0.09 | 7.0 | 4.3 | 4.0 | 4.0 | 4.1 | Present |
| 33 | " | 40 | 0.1 | 8.4 | 5.0 | 4.4 | 4.6 | 6.2 | Absent |
| 34 | " | 50 | 0.5 | 8.9 | 5.4 | 5.0 | 5.8 | 7.0 | " |

TABLE (2)-continued

| Sample No. | 99.9999 wt % of Au | Ge wt ppm | Be wt ppm | Room temperature tension B.L (grf) | EL (%) | 250° C. tension B.C (grf) | EL (%) | Bonding strength (grf) | Neck breakage |
|---|---|---|---|---|---|---|---|---|---|
| 35 | " | 60 | 0.6 | 10.4 | 4.7 | 5.7 | 5.9 | 8.2 | " |
| 36 | " | 62 | 0.9 | 11.0 | 3.9 | 6.1 | 5.8 | 4.8 | Oxidation of ball surface |
| Compared article | | | | | | | | | |
| 37 | Contains 99.995 wt % of gold, 0.0030 wt % of Ge and 0.00009 wt % of Be | | | 7.2 | 4.1 | 4.3 | 3.8 | 4.2 | Present |
| 38 | 99.999 wt % of Au | | | 5.5 | 3.1 | 2.5 | 3.8 | 3.8 | " |

TABLE (3)

| Sample No. | 99.9999 wt % of Au | Ge wt ppm | Be wt ppm | Room temperature tension B.L (grf) | EL (%) | 250° C. tension B.C (grf) | EL (%) | Bonding strength (grf) | Neck breakage |
|---|---|---|---|---|---|---|---|---|---|
| Embodiment | | | | | | | | | |
| 1 | Residual | 30 | 0.09 | 6.6 | 4.1 | 3.8 | 3.9 | 3.8 | Present |
| 2 | " | 32 | 0.1 | 6.9 | 4.5 | 4.1 | 4.1 | 5.8 | Absent |
| 3 | " | 40 | 0.5 | 8.1 | 5.9 | 4.7 | 5.5 | 6.7 | " |
| 4 | " | 50 | 0.6 | 9.2 | 5.3 | 5.5 | 5.6 | 7.6 | " |
| 5 | " | 60 | 0.9 | 10.6 | 4.2 | 5.8 | 5.5 | 8.4 | " |
| 6 | " | 62 | 1 | 11.4 | 3.7 | 6.3 | 5.1 | 5.2 | Breakage of grain boundary |
| 7 | " | 30 | 0.1 | 6.7 | 4.2 | 3.9 | 4.0 | 4.6 | Absent |
| 8 | " | 32 | 0.5 | 7.2 | 4.7 | 4.5 | 4.8 | 5.9 | " |
| 9 | " | 40 | 0.6 | 8.4 | 5.5 | 5.0 | 5.4 | 6.9 | " |
| 10 | " | 50 | 0.9 | 9.8 | 4.2 | 5.8 | 5.4 | 8.0 | " |
| 11 | " | 60 | 1 | 11.1 | 3.8 | 6.2 | 5.2 | 5.6 | Breakage of grain boundary |
| 12 | " | 62 | 0.09 | 6.9 | 4.1 | 4.5 | 4.5 | 4.9 | Present |
| 13 | " | 30 | 0.5 | 7.4 | 4.8 | 4.2 | 4.4 | 5.5 | Absent |
| 14 | " | 32 | 0.6 | 7.6 | 4.7 | 4.6 | 4.9 | 6.2 | " |
| 15 | " | 40 | 0.9 | 8.7 | 4.6 | 5.4 | 5.2 | 7.1 | " |
| 16 | " | 50 | 1 | 10.6 | 4.2 | 6.0 | 5.3 | 6.5 | Breakage of grain boundary |
| 17 | " | 60 | 0.09 | 8.5 | 4.5 | 4.3 | 4.4 | 4.9 | Present |
| 18 | " | 62 | 0.1 | 9.2 | 4.6 | 4.9 | 4.8 | 5.3 | Oxidation of ball surface |
| 19 | " | 30 | 0.6 | 7.4 | 4.5 | 4.5 | 4.7 | 5.6 | Absent |
| 20 | " | 32 | 0.9 | 8.5 | 4.4 | 5.1 | 4.9 | 6.5 | " |
| 21 | " | 40 | 1 | 10.1 | 4.3 | 5.8 | 5.2 | 6.1 | Breakage of grain boundary |
| 22 | " | 50 | 0.09 | 8.1 | 4.9 | 4.2 | 4.4 | 4.6 | Present |
| 23 | " | 60 | 0.1 | 8.7 | 4.7 | 4.8 | 4.8 | 6.6 | Absent |
| 24 | " | 62 | 0.5 | 10.0 | 5.0 | 5.3 | 5.8 | 5.1 | Oxidation of ball surface |
| 25 | " | 30 | 0.9 | 8.3 | 4.3 | 4.9 | 4.8 | 5.8 | Absent |
| 26 | " | 32 | 1 | 8.7 | 4.3 | 5.5 | 4.8 | 5.9 | Breakage of grain boundary |
| 27 | " | 40 | 0.09 | 7.7 | 4.7 | 4.0 | 4.3 | 4.3 | Present |
| 28 | " | 50 | 0.1 | 8.4 | 5.1 | 4.6 | 4.7 | 6.4 | Absent |
| 29 | " | 60 | 0.5 | 9.8 | 5.0 | 5.1 | 5.7 | 8.0 | " |
| 30 | " | 62 | 0.6 | 10.6 | 4.7 | 5.7 | 5.9 | 5.1 | Oxidation of ball surface |
| 31 | " | 30 | 1 | 8.5 | 4.3 | 5.4 | 4.7 | 5.8 | Absent |
| 32 | " | 32 | 0.09 | 6.7 | 4.3 | 3.9 | 3.9 | 4.1 | Present |
| 33 | " | 40 | 0.1 | 8.2 | 5.2 | 4.3 | 4.5 | 6.3 | Absent |
| 34 | " | 50 | 0.5 | 8.6 | 5.6 | 4.9 | 5.6 | 7.1 | " |
| 35 | " | 60 | 0.6 | 10.2 | 4.7 | 5.6 | 5.8 | 8.3 | " |
| 36 | " | 62 | 0.9 | 10.9 | 4.0 | 6.1 | 5.6 | 5.0 | Oxidation of ball surface |
| Compared article | | | | | | | | | |
| 37 | Contains 99.995 wt % of gold, 0.0030 wt % of Ge and 0.00009 wt % of Be | | | 7.2 | 4.1 | 4.3 | 3.8 | 4.2 | Present |
| 38 | 99.999 wt % of Au | | | 5.5 | 3.1 | 2.5 | 3.8 | 2.8 | " |

TABLE (4)

| Sample No. | 99.99995 wt % of Au | Ge wt ppm | Be wt ppm | Room temperature tension B.L (grf) | EL (%) | 250° C. tension B.C (grf) | EL (%) | Bonding strength (grf) | Neck breakage |
|---|---|---|---|---|---|---|---|---|---|
| Embodiment | | | | | | | | | |
| 1 | Residual | 30 | 0.09 | 6.5 | 4.2 | 3.8 | 3.8 | 3.8 | Present |
| 2 | " | 32 | 0.1 | 6.7 | 4.6 | 4.0 | 4.0 | 5.8 | Absent |

TABLE (4)-continued

| Sample No. | 99.99995 wt % of Au | Ge wt ppm | Be wt ppm | Room temperature tension B.L (grf) | Room temperature tension EL (%) | 250° C. tension B.C (grf) | 250° C. tension EL (%) | Bonding strength (grf) | Neck breakage |
|---|---|---|---|---|---|---|---|---|---|
| 3 | " | 40 | 0.5 | 7.9 | 5.9 | 4.6 | 5.5 | 6.8 | " |
| 4 | " | 50 | 0.6 | 9.0 | 5.3 | 5.3 | 5.5 | 7.7 | " |
| 5 | " | 60 | 0.9 | 10.2 | 4.2 | 5.7 | 5.5 | 8.4 | " |
| 6 | " | 62 | 1 | 11.0 | 3.7 | 6.1 | 5.0 | 5.2 | Breakage of grain boundary |
| 7 | " | 30 | 0.1 | 6.6 | 4.3 | 3.8 | 3.9 | 4.6 | Absent |
| 8 | " | 32 | 0.5 | 7.1 | 4.7 | 4.4 | 4.8 | 5.4 | " |
| 9 | " | 40 | 0.6 | 8.3 | 5.5 | 4.8 | 5.4 | 7.0 | " |
| 10 | " | 50 | 0.9 | 9.5 | 4.2 | 5.7 | 5.3 | 8.0 | " |
| 11 | " | 62 | 1 | 10.7 | 3.8 | 6.0 | 5.1 | 5.5 | Breakage of grain boundary |
| 12 | " | 62 | 0.09 | 8.3 | 4.6 | 4.3 | 4.4 | 4.8 | Present |
| 13 | " | 30 | 0.5 | 9.5 | 4.1 | 4.1 | 4.3 | 5.5 | Absent |
| 14 | " | 32 | 0.6 | 10.7 | 4.5 | 4.5 | 4.9 | 6.2 | " |
| 15 | " | 40 | 0.9 | 8.4 | 4.6 | 5.3 | 5.1 | 7.1 | " |
| 16 | " | 50 | 1 | 10.2 | 4.2 | 5.8 | 5.2 | 6.5 | Breakage of grain boundary |
| 17 | " | 60 | 0.09 | 8.2 | 4.6 | 4.3 | 4.4 | 4.8 | Present |
| 18 | " | 62 | 0.1 | 8.8 | 4.7 | 4.8 | 4.7 | 6.9 | Oxidation of ball surface |
| 19 | " | 30 | 0.6 | 7.3 | 4.5 | 4.4 | 4.6 | 5.6 | Absent |
| 20 | " | 32 | 0.9 | 8.2 | 4.4 | 5.0 | 4.9 | 6.5 | " |
| 21 | " | 40 | 1 | 9.8 | 4.3 | 5.7 | 5.2 | 6.2 | Breakage of grain boundary |
| 22 | " | 50 | 0.09 | 7.9 | 5.0 | 4.1 | 4.3 | 4.6 | Present |
| 23 | " | 60 | 0.1 | 8.6 | 4.8 | 4.7 | 4.7 | 6.7 | Absent |
| 24 | " | 62 | 0.5 | 9.7 | 5.0 | 5.2 | 5.7 | 5.0 | Oxidation of ball surface |
| 25 | " | 30 | 0.9 | 8.0 | 4.4 | 4.7 | 4.7 | 5.8 | Absent |
| 26 | " | 32 | 1 | 8.4 | 4.3 | 5.4 | 4.8 | 5.9 | Breakage of grain boundary |
| 27 | " | 40 | 0.09 | 7.5 | 4.8 | 3.8 | 4.2 | 4.2 | Present |
| 28 | " | 50 | 0.1 | 8.2 | 5.1 | 4.5 | 4.6 | 6.5 | Absent |
| 29 | " | 60 | 0.5 | 9.6 | 5.0 | 5.0 | 5.6 | 8.1 | " |
| 30 | " | 62 | 0.6 | 10.2 | 4.7 | 5.6 | 5.8 | 5.0 | Oxidation of ball surface |
| 31 | " | 30 | 1 | 8.1 | 4.3 | 5.3 | 4.7 | 5.8 | Absent |
| 32 | " | 32 | 0.09 | 6.6 | 4.4 | 3.8 | 3.8 | 4.0 | Present |
| 33 | " | 40 | 0.1 | 8.0 | 5.3 | 4.2 | 4.4 | 6.4 | Absent |
| 34 | " | 50 | 0.5 | 8.5 | 5.6 | 4.8 | 5.6 | 7.2 | " |
| 35 | " | 60 | 0.6 | 10.0 | 4.7 | 5.5 | 5.7 | 8.4 | " |
| 36 | " | 62 | 0.9 | 10.5 | 4.0 | 6.0 | 5.5 | 5.0 | Oxidation of ball surface |
| | | | | | Compared article | | | | |
| 37 | Contains 99.995 wt % of gold, 0.0030 wt % of Ge and 0.00009 wt % of Be | | | 7.0 | 3.8 | 3.8 | 4.1 | 4.2 | Present |
| 38 | 99.999 wt % of Au | | | 5.5 | 3.1 | 2.5 | 3.8 | 3.8 | " |

As a result, gold lines for bonding, containing gold having a purity level within the range of 99.996–99.99995 wt% of high purity gold (Au), 0.0032–0.0060 wt% of germanium (Ge) and 0.00001–0.00009 wt% of beryllium (Be) were confirmed to provide high mechanical strength such as tensile strength and high temperature strength and the high bonding strength after bonding and obviate the neck breakage.

What is claimed is:

1. A gold wire for bonding semiconductor elements consisting essentially of a gold alloy consisting essentially of gold having a purity level within the range of 99.996–99.99995 wt% by total weight of said gold and germanium present in an amount within the range of 0.0032–0.008 wt% by total weight of said alloy and beryllium present in an amount with the range of 0.00001–0.00009 wt% by total weight of said alloy.

2. The gold wire in accordance with claim 1, wherein said germanium is present in an amount of about 0.0032 wt% by total weight of said alloy and said beryllium is present in an amount of about 0.00009 wt% by total weight of said alloy.

3. The gold wire in accordance with claim 1, exhibiting a 250° C. tension value of greater than 3.5 grf.

* * * * *